(12) United States Patent
Choi et al.

(10) Patent No.: US 9,953,576 B2
(45) Date of Patent: Apr. 24, 2018

(54) ORGANIC LIGHT-EMITTING DIODE DISPLAY

(71) Applicant: Samsung Display Co., Ltd., Yongin-si, Gyeonggi-do (KR)

(72) Inventors: Jung-Mi Choi, Seoul (KR); Chul Kyu Kang, Suwon-si (KR); Kyung Hoon Chung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 85 days.

(21) Appl. No.: 14/971,877

(22) Filed: Dec. 16, 2015

(65) Prior Publication Data

US 2016/0321993 A1    Nov. 3, 2016

(30) Foreign Application Priority Data

Apr. 29, 2015 (KR) .................. 10-2015-0060659

(51) Int. Cl.
| | |
|---|---|
| G09G 3/36 | (2006.01) |
| G09G 3/3258 | (2016.01) |
| H01L 27/32 | (2006.01) |
| G09G 3/20 | (2006.01) |
| G09G 3/3291 | (2016.01) |
| G09G 3/3266 | (2016.01) |
| G09G 3/3225 | (2016.01) |

(52) U.S. Cl.
CPC ......... *G09G 3/3258* (2013.01); *G09G 3/2003* (2013.01); *G09G 3/2018* (2013.01);
(Continued)

(58) Field of Classification Search
CPC .. G09G 3/32; G09G 3/20; G09G 3/36; G09G 5/00; G09G 3/30; H01L 27/32; H01L 51/52; G06F 3/038; G06F 3/041; G06F 3/045
See application file for complete search history.

(56) References Cited

U.S. PATENT DOCUMENTS 8,743,107 B2 * 6/2014 Kim .................. G09G 3/20
345/204
2002/0140646 A1 * 10/2002 Sato .................. G09G 3/3233
345/82

(Continued)

FOREIGN PATENT DOCUMENTS

| | | | |
|---|---|---|---|
| KR | 10-0669765 B1 | 1/2007 | |
| KR | 10-2008-0023498 A | 3/2008 | |

(Continued)

*Primary Examiner* — Pegeman Karimi
(74) *Attorney, Agent, or Firm* — Knobbe Martens Olson & Bear LLP

(57) ABSTRACT

An organic light-emitting diode display is disclosed. In one aspect, the display includes a display substrate including a display area and a peripheral area surrounding the display area. Scan lines are formed over the display substrate and configured to transmit a scan signal, data lines and driving voltage lines crossing the scan lines are configured to respectively provide a data signal and a driving voltage, and switching elements are electrically connected to the scan lines and data lines. Pixel electrodes are electrically connected to the switching elements, an organic emission layer is formed over the pixel electrodes, and a common electrode is formed over the organic emission layer. A common voltage line is formed substantially parallel to the data lines and configured to transmit a common voltage to the common electrode.

19 Claims, 10 Drawing Sheets

(52) U.S. Cl.
CPC ......... *G09G 3/3225* (2013.01); *G09G 3/3266* (2013.01); *G09G 3/3291* (2013.01); *H01L 27/3223* (2013.01); *H01L 27/3276* (2013.01); *G09G 2300/0413* (2013.01); *G09G 2300/0426* (2013.01); *G09G 2300/0452* (2013.01); *G09G 2310/027* (2013.01); *G09G 2310/0278* (2013.01); *G09G 2310/08* (2013.01)

(56) References Cited

U.S. PATENT DOCUMENTS

| | | | | |
|---|---|---|---|---|
| 2006/0022968 | A1* | 2/2006 | Kondo | G09G 3/3208 345/211 |
| 2006/0279489 | A1* | 12/2006 | Ouchi | G09G 3/20 345/76 |
| 2008/0291144 | A1* | 11/2008 | Chen | G09G 3/3655 345/89 |
| 2009/0146929 | A1* | 6/2009 | Kim | H01L 51/5278 345/77 |
| 2009/0267526 | A1* | 10/2009 | Sung | H01L 51/529 315/169.3 |
| 2015/0091851 | A1* | 4/2015 | Reynolds | G06F 3/0412 345/174 |

FOREIGN PATENT DOCUMENTS

| | | |
|---|---|---|
| KR | 10-0830981 B1 | 5/2008 |
| KR | 10-2012-0019016 A | 3/2012 |
| KR | 10-1178912 B1 | 8/2012 |

\* cited by examiner

ORGANIC LIGHT-EMITTING DIODE DISPLAY

CROSS-REFERENCE TO RELATED APPLICATION

This application claims priority to and the benefit of Korean Patent Application No. 10-2015-0060659 filed in the Korean Intellectual Property Office on Apr. 29, 2015, the entire contents of which are incorporated herein by reference.

BACKGROUND

Field

The described technology generally relates to an organic light-emitting diode display.

Description of the Related Technology

An organic light-emitting diode (OLED) includes two electrodes and an organic light emitting layer positioned therebetween. Electrons injected from a cathode electrode and holes injected from an anode electrode are bonded to each other in the organic light emitting layer to form excitons. Light is emitted when the excitons discharge energy.

An OLED display includes a matrix of pixels, thin film transistors and capacitors for driving the OLED formed in each pixel.

An OLED display can include one of two driving methods: an analog driving method in which current is changed to generate gray levels and a digital driving method in which emitting time is controlled by a switching operation of a driving transistor to generate gray levels. For example, in the digital driving method, it is crucial for a driving transistor inside a pixel to stably implement as many sub frames as possible in one frame. Accordingly, in order to minimize the load of a data line, data line resistance should be decreased and an voltage (IR) drop should be minimized.

In the case of the digital driving method, since the driving voltage is directly applied to the OLED to determine luminance, the influence of the IR drop is strong, such that a luminance deviation due to a current deviation is greatly increased and thus, long range uniformity (LRU) of the OLED display panel decreases.

That is, in the pixel close to an external driving voltage supplier, since the IR drop amount is small, the driving voltage applied to the OLED is high compared to the pixel far from the external driving voltage supplier. Accordingly, the amount of the driving current is relatively increased in the pixel close to the external driving voltage supplier and the temperature at the close pixel increases compared to the far pixel. As described above, due to the increase of the temperature of the pixel close to the external driving voltage supplier as well as the increase of the driving voltage, a driving current deviation is generated between the close pixel and the far pixel, such that a luminance deviation is generated.

Also, the luminance of the close pixel is very bright, such that the lifespan of the close pixel close can be shortened.

The above information disclosed in this Background section is only to enhance the understanding of the background of the disclosure and therefore it can contain information that does not form the prior art that is already known in this country to a person of ordinary skill in the art.

SUMMARY OF CERTAIN INVENTIVE ASPECTS

One inventive aspect relates to an OLED display that can improve luminance uniformity and concurrently minimize IR drop of a common voltage line.

Another aspect is an OLED display that includes a display substrate including a display area in which a plurality of pixels is positioned and a peripheral area positioned outside the display area; a plurality of scan lines formed on the display substrate and transmitting a scan signal; a plurality of data lines and driving voltage lines crossing the plurality of scan lines and respectively transmitting a data signal and a driving voltage; a plurality of switching elements connected to the plurality of scan lines and data lines; a plurality of pixel electrodes connected to the plurality of switching elements; an organic emission layer formed on the pixel electrode; a common electrode formed on the organic emission layer; and a common voltage line disposed parallel to the data line and transmitting a common voltage to the common electrode, wherein the common voltage line includes a common voltage input line connected to an external common voltage input section positioned in the peripheral area and a common voltage output line connected to the common electrode.

The common voltage line can further include a common voltage connection part connecting the common voltage input line and the common voltage output line to each other.

The display area can include an upper region corresponding to an upper half of the display area, a lower region corresponding to a lower half of the display area, and a center line region corresponding to the area between the upper region and the lower region, and the common voltage connection part can be positioned in the center line region.

A dummy pixel electrode connected to the common voltage output line and a laser connection part directly connecting the common electrode and the common voltage output line can be further included.

The common voltage line can be positioned in the same layer as the data line and the driving voltage line.

An interlayer insulating layer covering the scan line can be further included, and the common voltage line can be formed on the interlayer insulating layer.

A passivation layer covering the interlayer insulating layer and the common voltage line can be further included, and the dummy pixel electrode can be formed on the passivation layer.

The laser connection part can penetrate the passivation layer and the dummy pixel electrode.

The common voltage input line can include an upper common voltage input line positioned in the upper region and a lower common voltage input line positioned in the lower region, the common voltage output line can include an upper common voltage output line positioned in the upper region and a lower common voltage output line positioned in the lower region, and the upper common voltage input line and the upper common voltage output line can be separated to be parallel to each other, and the lower common voltage input line and the lower common voltage output line can be separated to be parallel to each other.

The external common voltage input section can include a first external common voltage input section adjacent to the upper region and a second external common voltage input section adjacent to the lower region, the first external common voltage input section can be connected to the upper common voltage input line, and the second external common voltage input section can be connected to the lower common voltage input line.

A width size of the common voltage output line can be more than the width size of the common voltage input line.

The plurality of pixels can include a red pixel emitting a red, a green pixel emitting a green, and a blue pixel emitting a blue, the plurality of driving voltage lines can include a red driving voltage line applied to the red pixel, a green driving voltage line applied to the green pixel, and a blue driving voltage line applied to the blue pixel, and the sum of the width of the red driving voltage line, the width of the green driving voltage line, and the width of the blue driving voltage line can be more than the width of the common voltage output line.

The switching element can include a switching transistor and a driving transistor, and a digital driver formed in the peripheral area and using a digital driving method expressing a gray by controlling an emission time through a switching operation of the driving transistor can be further included.

Another aspect is an organic light-emitting diode (OLED) display comprising: a display substrate including a display area including a plurality of pixels and a peripheral area surrounding the display area; a plurality of scan lines formed over the display substrate and configured to transmit a scan signal; a plurality of data lines and driving voltage lines crossing the scan lines and configured to respectively provide a data signal and a driving voltage; a plurality of switching elements electrically connected to the scan lines and data lines; a plurality of pixel electrodes electrically connected to the switching elements; an organic emission layer formed over the pixel electrodes; a common electrode formed over the organic emission layer; and a common voltage line formed substantially parallel to the data lines and configured to transmit a common voltage to the common electrode, wherein the common voltage line includes i) a common voltage input line electrically connected to an external common voltage input electrode formed in the peripheral area and ii) a common voltage output line electrically connected to the common electrode.

In the above OLED display, the common voltage line further includes a common voltage connector configured to electrically connect the common voltage input line to the common voltage output line.

In the above OLED display, the display area includes an upper region corresponding to an upper half of the display area, a lower region corresponding to a lower half of the display area, and a center line region corresponding to the area between the upper and lower regions, and wherein the common voltage connector is located in the center line region.

The above OLED display further comprises: a dummy pixel electrode electrically connected to the common voltage output line; and a laser connector directly connected to the common electrode and the common voltage output line.

In the above OLED display, the common voltage line is formed on the same layer as the data line and the driving voltage line.

The above OLED display further comprises an interlayer insulating layer covering the scan line, wherein the common voltage line is formed over the interlayer insulating layer.

The above OLED display further comprises a passivation layer covering the interlayer insulating layer and the common voltage line, wherein the dummy pixel electrode is formed over the passivation layer.

In the above OLED display, the laser connector penetrates the passivation layer and the dummy pixel electrode.

In the above OLED display, the common voltage input line includes an upper common voltage input line located in the upper region and a lower common voltage input line located in the lower region, wherein the common voltage output line includes an upper common voltage output line located in the upper region and a lower common voltage output line located in the lower region, wherein the upper common voltage input line and the upper common voltage output line are separated from and substantially parallel to each other, and wherein the lower common voltage input line and the lower common voltage output line are separated from and substantially parallel to each other.

In the above OLED display, the external common voltage input electrode includes a first external common voltage input electrode adjacent to the upper region and a second external common voltage input electrode adjacent to the lower region, wherein the first external common voltage input electrode is electrically connected to the upper common voltage input line, and wherein the second external common voltage input electrode is electrically connected to the lower common voltage input line.

In the above OLED display, the width of the common voltage output line is greater than the width of the common voltage input line.

In the above OLED display, the pixels include red, green and blue pixels configured to respectively emit red, green and blue colors, wherein the driving voltage lines includes red, green and blue driving voltage lines electrically connected to the red, green and blue pixels, respectively, and wherein the sum of the widths of the red, green and blue driving voltage lines is greater than the width of the common voltage output line.

In the above OLED display, the switching element includes a switching transistor and a driving transistor, wherein the OLED display further comprises a digital driver formed in the peripheral area and configured to drive the OLED display using a digital driving method configured to control an emission time via a switching operation of the driving transistor so as to generate a gray scale to drive the pixels.

Another aspect is an organic light-emitting diode (OLED) display comprising: a display panel including a display area and a peripheral area surrounding the display area, wherein the display area includes an upper region and a lower region; upper and lower timing controllers configured to receive an image signal and output a control signal, wherein the display panel is located between the upper and lower timing controllers; upper and lower data drivers configured to receive the control signal and provide a data signal to the display area, wherein the upper data driver is located between the upper timing controller and the display panel, and wherein the lower data driver is located between the lower timing controller and the display panel; upper and lower organic light-emitting diodes (OLEDs) formed in the display area, wherein the upper OLEDs are formed in the upper region of the display area, and wherein the lower OLEDs are formed in the lower region of the display area; and upper and lower common voltage lines each configured to transmit a common voltage from the upper and lower timing controllers to the upper and lower OLEDs, respectively.

In the above OLED display, each of the upper and lower common voltage lines includes i) a common voltage input line connected to the respective timing controller, ii) a common voltage output line connected to the OLEDs and iii) a common voltage connector connected to the common voltage input and output lines.

The above OLED display further comprises: an external common voltage input electrodes formed in the peripheral area and connected to one of the upper and lower timing controllers; a peripheral connector formed on the external common voltage input electrode; and an external connector connected to the peripheral connector and one of the upper and lower common voltage input lines, wherein the external common voltage input electrode, the peripheral connector and the external connector are configured to transmit the common voltage from the one of the upper and timing controllers to at least one of the OLEDs.

In the above OLED display, each of the OLEDs includes a common electrode formed over the external connector.

In the above OLED display, the thickness of the common electrode is similar to the thickness of the external connector.

In the above OLED display, the display area further includes a center region located between the upper and lower regions, wherein the common voltage connector is located in the center region and not the upper and lower regions.

In the above OLED display, the common voltage input line, common voltage output line and common voltage connector are formed on the same layer.

According to at least one of the disclosed embodiments, in the large-sized OLED display of the digital driving method, by forming the common voltage line including the common voltage input line and the common voltage output line, the voltage drop of the common voltage line can be minimized and luminance uniformity can be simultaneously improved.

DETAILED DESCRIPTION OF CERTAIN INVENTIVE EMBODIMENTS

Figure 1:
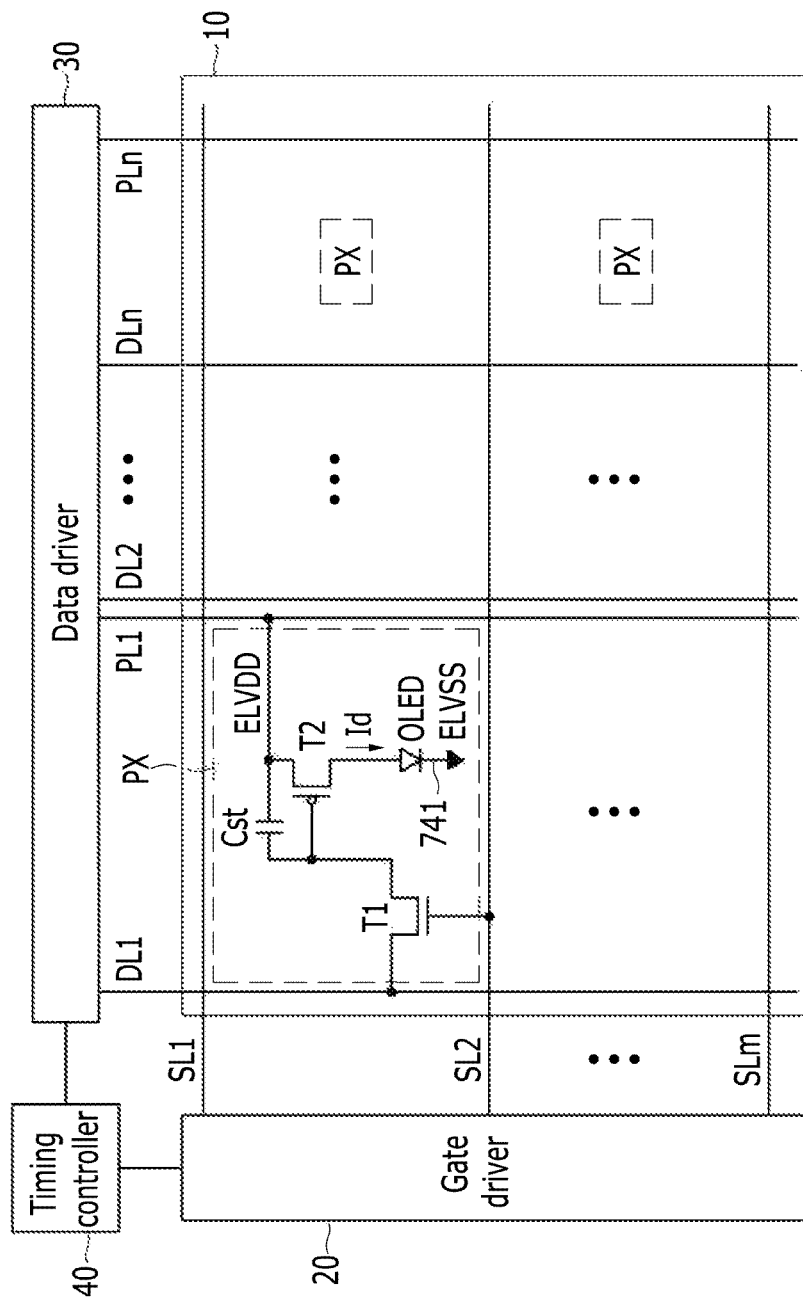
FIG. 1 is a block diagram of an OLED display according to an exemplary embodiment of the present disclosure.

The present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

The drawings and description are to be regarded as illustrative in nature and not restrictive. Like reference numerals designate like elements throughout the specification.

Further, in the drawings, a size and thickness of each element are randomly represented for better understanding and ease of description, and the present disclosure is not limited thereto. In the drawings, the thickness of layers, films, panels, regions, etc., are exaggerated for clarity. In the drawings, the thicknesses of some layers and areas are exaggerated for easy explanation.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements can also be present. Throughout this specification, it is understood that the term "on" and similar terms are used generally and are not necessarily related to a gravitational reference.

Further, in the specification, the word "in plan view" means when an object portion is viewed from the above, and the word "in cross section" means when a cross section taken by vertically cutting an object portion is viewed from the side.

Further, the present disclosure is not limited to the number of thin film transistors TFT and capacitors illustrated in the accompanying drawings, and the OLED display can include a plurality of thin film transistors and one or more capacitors in one pixel, and a separate wire can be further formed or a known wire can be omitted to provide various structures. Here, a pixel means a minimum unit displaying an image, and the OLED display displays an image through a plurality of pixels. In this disclosure, the term "substantially" includes the meanings of completely, almost completely or to any significant degree under some applications and in accordance with those skilled in the art. The term "connected" can include an electrical connection.

Now, an OLED display according to an exemplary embodiment of the present disclosure will be described with reference to the accompanying drawings.

FIG. 1 is a schematic diagram of an OLED display according to an exemplary embodiment of the present disclosure.

As shown in FIG. 1, the OLED display according to the exemplary embodiment of the present disclosure includes an OLED display panel 10, a scan driver 20, a data driver 30, and a timing controller 40.

The OLED display panel 10 includes a plurality of scan lines SL1 to SLm, a plurality of data lines DL1 to DLn, and a plurality of driving voltage lines PL1 to PLn that cross each other to define each pixel PX. The scan lines SL1 to SLm can substantially extend in a row direction and are substantially parallel to each other, and the data lines DL1 to DLn and the driving voltage lines PL1 to PLn can substantially extend in a column direction and are substantially parallel to each other.

Each pixel PX includes a switching transistor T1 that is respectively coupled to the scan lines SL1 to SLm and the data lines DL1 to DLn, a storage capacitor Cst and a driving transistor T2 that are respectively coupled between the switching transistors T1 and the driving voltage lines PL1 to PLn, and an OLED that is coupled to the driving transistor T2.

The scan driver 20 applies a scan signal to the scan lines SL1 to SLm, and the data driver 30 applies a data signal to the data lines DL1 to DLn.

The switching transistor T1 includes a control terminal, an input terminal, and an output terminal such that the control terminal is coupled to the scan lines SL1 to SLm, the input terminal is coupled to the data lines DL1 to DLn, and the output terminal is coupled to the driving transistor T2. In response to the scan signal applied to the scan lines SL1 to SLm, the switching transistor T1 transmits the data signal applied to the data lines DL1 to DLn to the driving transistor T2.

The driving transistor T2 also includes a control terminal, an input terminal, and an output terminal such that the control terminal is coupled to the switching transistor T1, the input terminal is coupled to the driving voltage lines PL1 to PLn, and the output terminal is coupled to the OLED.

The OLED has an anode connected to the output terminal of the driving transistor T2 and a cathode connected to a common voltage line 741 transmitting the common voltage ELVSS.

When the switching transistor T1 is turned on according to the scan signal, the data signal is charged to the storage capacitor Cst and the control terminal of the driving transistor T2, and as a result, the driving transistor T2 is turned on to apply the driving voltage ELVDD of the driving voltage lines PL1 to PLn to the OLED, thereby allowing the OLED to emit light.

The timing controller 40 receives image signals and various control signals from an external system (not shown), and generates RGB signals, a data control signal, and a scan control signal to transmit them to the scan driver 20 and the data driver 30.

Figure 2:
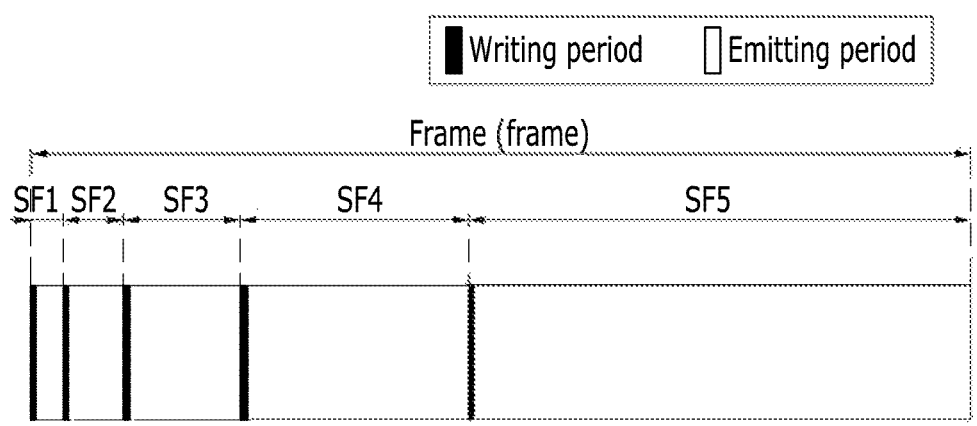
FIG. 2 is a timing diagram to describe a digital driving method of an OLED display according to an exemplary embodiment of the present disclosure.

FIG. 2 is a timing diagram to describe a digital driving method of an OLED display according to the exemplary embodiment of the present disclosure.

As shown in FIG. 2, in the digital driving method, gray levels of the image can be displayed for each frame that consists of a plurality of sub-fields.

In this case, each sub-field can include a writing period for inputting the data signal to each pixel and an emitting period for allowing the OLED to actually emit light, and can further include an erasing period for stopping the light emission of the OLED.

For example, when 32 gray levels are used to display an image, one frame is divided into first to fifth sub-fields SF1 to SF5, as shown in FIG. 2, and the first to fifth sub-fields SF1 to SF5 are respectively subdivided into the writing period and the emitting period. In addition, a length of the emitting period can be adjusted to set a binary weight of the corresponding sub-field. For example, a weight value of the first sub-field SF1 is set to $2^0$ and a weight value of the second sub-field SF2 is set to $2^1$, such that the weight value of each sub-field can be determined to increase at a rate of $2^n$ (n=0, 1, 2, 3, 4). The frame having such a structure can implement an image with a total of 32 ($=2^5$) gray levels. For example, when implementing the image with 32 gray levels, all of the sub-fields from the first sub-field SF1 to the fifth sub-field SF5 are on. That is, 32 gray levels can be displayed by supplying the data signal for turning on the OLED to the data line for the respective writing periods of the first sub-field SF1 to the fifth sub-field SF5, and allowing the OLED to emit light for the respective emitting periods following the respective writing periods. Alternatively, when the image of 10 gray levels is implemented, the second sub-field SF2 having a weight value of 2 ($=2^1$) and the fourth sub-field SF4 having a weight value of 8 ($=2^3$) need to be on. That is, by supplying the data signal for turning on the OLED to the data line for the respective writing periods of the second and fourth sub-fields SF2 and SF4, and the data signal for turning off the OLED to the data line for the respective writing periods of the first, third, and fifth sub-fields SF1, SF3, and SF5, the OLED can emit light for the respective emitting periods of the second and fourth sub-fields SF2 and SF4 while not emitting light for the respective emitting periods of the first, third, and fifth sub-fields SF1, SF3, and SF5, thereby displaying the image with 10 gray levels.

As described above, since the data signal applied to each pixel has two voltage values for turning on or turning off the OLED, such a time-division driving method is referred to as a digital driving method. A digital driver 1 formed to use the digital driving method can be formed in the timing controller 40. However, it is not limited thereto and the digital driver 1 can be formed in the scan driver 20 or the data driver 30.

In FIG. 2, 5-bit driving in which one frame consists of five sub-fields is exemplarily described, but the number of sub-fields included in one frame can be variously changed. Further, FIG. 2 illustrates an example in which the sub-fields are sequentially arranged in an increasing order of weight values in one frame, but the sub-fields can be sequentially arranged in a decreasing order of weight values in one frame or can be arranged irrespective of weight values.

Figure 3:
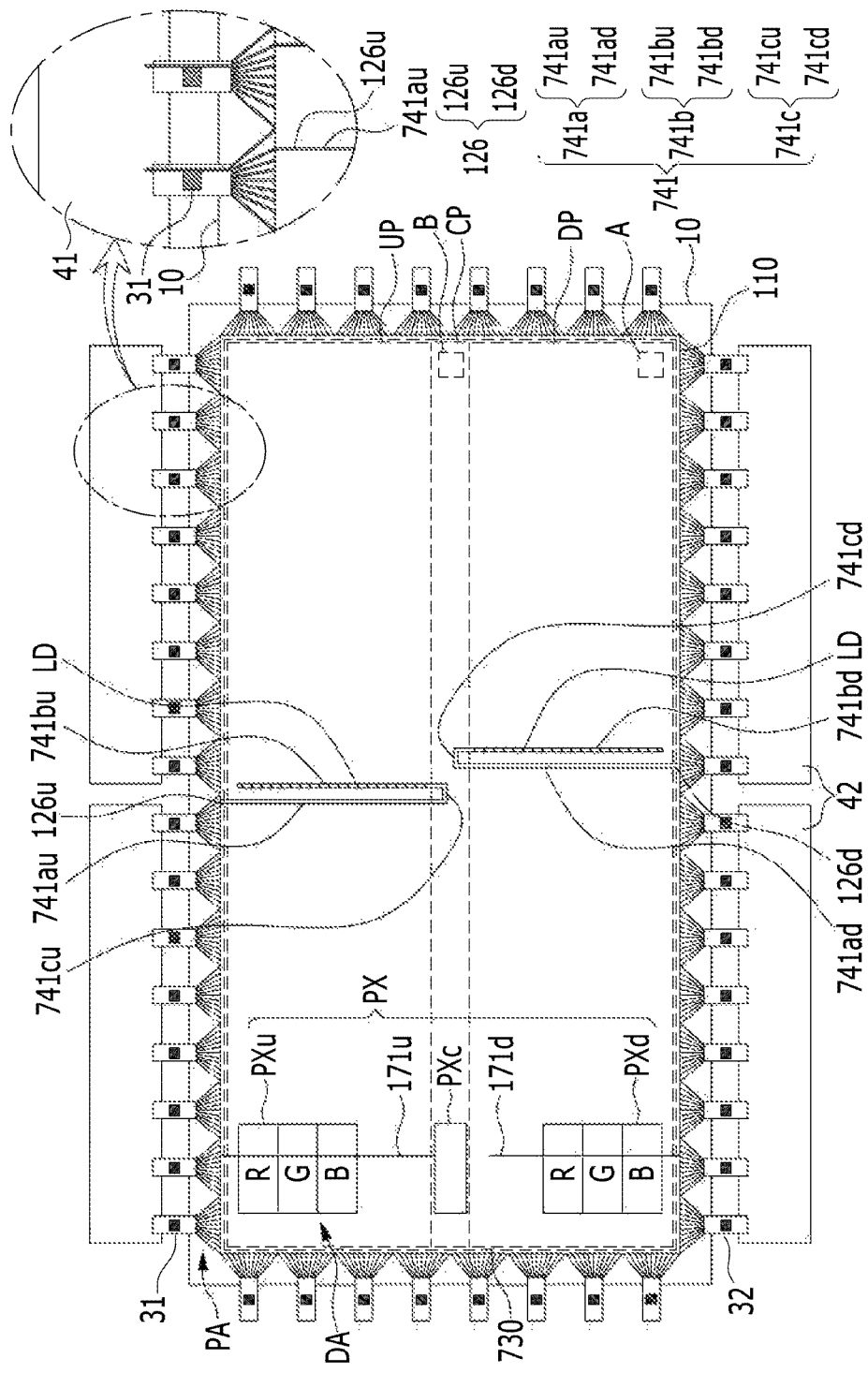
FIG. 3 is a schematic top plan view of an OLED display according to an exemplary embodiment of the present disclosure.

FIG. 3 is a schematic top plan view of an OLED display according to an exemplary embodiment of the present disclosure.

As shown in FIG. 3, an upper data driver 31 and a lower data driver 32 are respectively attached to upper and lower parts of the OLED display panel 10. The upper data driver 31 and the lower data driver 32 are respectively connected to the upper timing controller 41 and the lower timing controller 42.

The OLED display panel 10 includes a display substrate 110 and a plurality of pixels PX formed on the display substrate 110. The display substrate 110 includes a display area DA, in which a plurality of pixels PX is positioned, and a peripheral area PA corresponding to a surrounding of the display area DA. The display area DA includes an upper region UP corresponding to an upper-half portion of the display area DA, a lower region DP corresponding to a lower-half portion of the display area DA, and a center line region CP between the upper region UP and the lower region DP.

A plurality of upper pixels PXu is formed in the upper region UP, a plurality of lower pixels PXd is formed in the lower region DP, and a center pixel PXc is formed in the center line region CP. Also, the data line 171 is divided into an upper data line 171u, which transmits the data signal to the upper pixels PXu and the center pixel PXc, and a lower data line 171d, which transmits the data signal to the lower pixels PXd. In the present exemplary embodiment, the upper data line 171*u* is connected to the center pixel PXc, but the lower data line 171*d* can be connected to the center pixel PXc.

Accordingly, the upper data driver 31 transmits the data signal to the upper pixels PXu and the center pixel PXc through the upper data line 171*u*, and the lower data driver 32 transmits the data signal to the lower pixels PXd through the lower data line 171*d*. As described above, since a plurality of pixels is divided into the upper pixels PXu and the center pixel PXc and the lower pixel PXd to be driven, the resistance of the data line 171 is decreased such that a load of the data line 171 can be reduced by about half.

The common voltage line 741 includes a common voltage input line 741*a*, a common voltage output line 741*b*, and a common voltage connection part (or common voltage connector) 741*c* connecting the common voltage input line 741*a* and the common voltage output line 741*b* to each other.

The common voltage input line 741*a* includes an upper common voltage input line 741*au* positioned in the upper region UP and a lower common voltage input line 741*ad* positioned in the lower region DP. Also, the common voltage output line 741*b* includes an upper common voltage output line 741*bu* positioned in the upper region UP and a lower common voltage output line 741*bd* positioned in the lower region DP. The upper common voltage input line 741*au* and the upper common voltage output line 741*bu* extend in parallel and separated from each other, and the lower common voltage input line 741*ad* and the lower common voltage output line 741*bd* extend in parallel and separated from each other.

An external common voltage input section (or external common voltage input electrode) 126 includes a first external common voltage input section (or first external common voltage input electrode) 126*u* close to the upper region UP and a second external common voltage input section (or second external common voltage input electrode) 126*d* close to the lower region DP. The first external common voltage input section 126*u* is connected to the upper common voltage input line 741*au* and the second external common voltage input section 126*d* is connected to the lower common voltage input line 741*ad*. The first external common voltage input section 126*u* and the second external common voltage input section 126*d* can be formed in the peripheral area PA.

The common voltage connection part 741*c* is formed in the center line region CP and includes an upper common voltage connection part 741*cu* connecting the upper common voltage input line 741*au* to the upper common voltage output line 741*bu* and a lower common voltage connection part 741*cd* connecting the lower common voltage input line 741*ad* to the lower common voltage output line 741*bd*.

The common voltage ELVSS is directly transmitted from the upper timing controller 41 and the lower timing controller 42 to the center line region CP through the common voltage input line 741*a*, that is, the upper common voltage input line 741*au* and the lower common voltage input line 741*ad*. The common voltage input line 741*a* is not directly connected to the common electrode 730 covering the entire area of the display area DA. Also, in the center line region CP, the common voltage input line 741*a* is connected to the common voltage output line 741*b* through the common voltage connection part 741*c*. Accordingly, the common voltage ELVSS is transmitted from the center line region CP to the upper region UP and the lower region DP. In this case, the common voltage output line 741*b* is directly connected to the common electrode 730.

The common voltage is transmitted from the peripheral area PA to the center line region CP through the common voltage input line 741*a*. In this case, since the common voltage input line 741*a* is not directly connected to the common electrode 730, the IR drop of the common voltage is small. Also, the common voltage ELVSS is transmitted to the common electrode 730 from the center line region CP to the upper region UP and the lower region DP through the common voltage output line 741*b*. In this case, the common voltage output line 741*b* is directly connected to the common electrode 730 such that the IR drop of the common voltage ELVSS is generated to a certain extent.

Accordingly, the common voltage is increased close to the upper region UP and the lower region DP from the center line region CP. That is, the common voltage ELVSS is the (−) voltage such that the common voltage is increased by the IR drop. This means that the common voltage ELVSS is decreased from the upper region UP and the lower region DP to the center line region CP.

Figure 4:
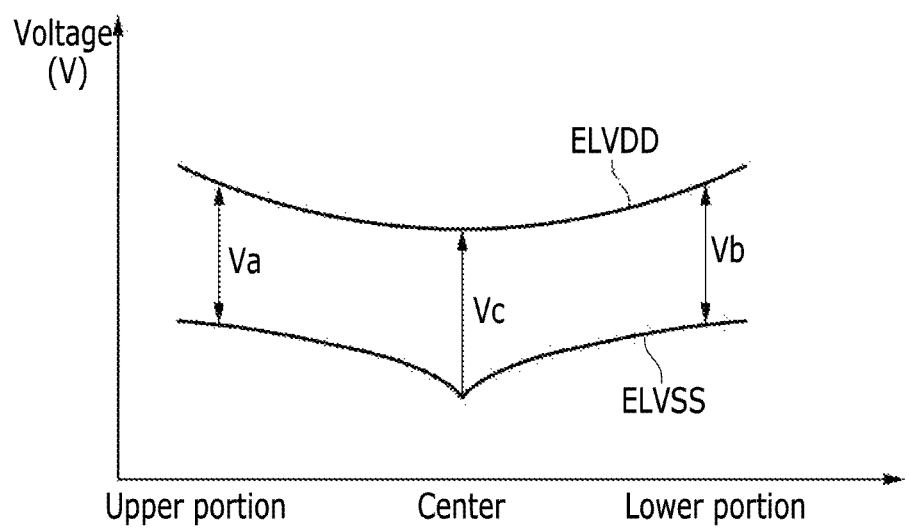
FIG. 4 is a graph showing the magnitude of change between a driving voltage ELVDD and a common voltage ELVSS depending on a longitude position of an OLED display panel of an OLED display according to an exemplary embodiment of the present disclosure.

FIG. 4 is a graph showing the magnitude of change between a driving voltage ELVDD and a common voltage ELVSS depending on a longitude position of an OLED display panel of an OLED display according to an exemplary embodiment of the present disclosure.

As shown in FIG. 4, the driving voltage ELVDD is deteriorated from the upper region UP and the lower region DP close to the center line region CP, and the common voltage ELVSS is increased from the upper region UP and the lower region DP close to the center line region CP. Accordingly, a difference in value Va between the driving voltage ELVDD and the common voltage ELVSS in the lower region DP, a difference in value Vb between the driving voltage ELVDD and the common voltage ELVSS in the center line region CP, and a difference in value Vc between the driving voltage ELVDD and the common voltage ELVSS in the upper region UP are similar to each other. As described above, since the difference between the driving voltage ELVDD and the common voltage ELVSS is similar in the center line region CP, the upper region UP, and the lower region DP, the luminance corresponding to the difference between the driving voltage ELVDD and the common voltage ELVSS is similar to each other in the center line region CP, the upper region UP, and the lower region DP.

As described above, by forming the common voltage input line 741*a* and the common voltage output line 741*b* separated from each other and connecting them by using the common voltage connection part 741*c* positioned in the center line region CP, the IR drop of the common voltage ELVSS can be minimized and luminance uniformity can be substantially simultaneously (or concurrently) improved.

Next, a common voltage input line and an external common voltage input section positioned in the display area and the peripheral area adjacent thereto of the OLED display shown in FIG. 1 and FIG. 3 will be described in detail with reference to FIG. 5 and FIG. 6. Hereafter, for better comprehension and ease of description, the lower common voltage input line as a common voltage input line will be simply described.

Figure 5:
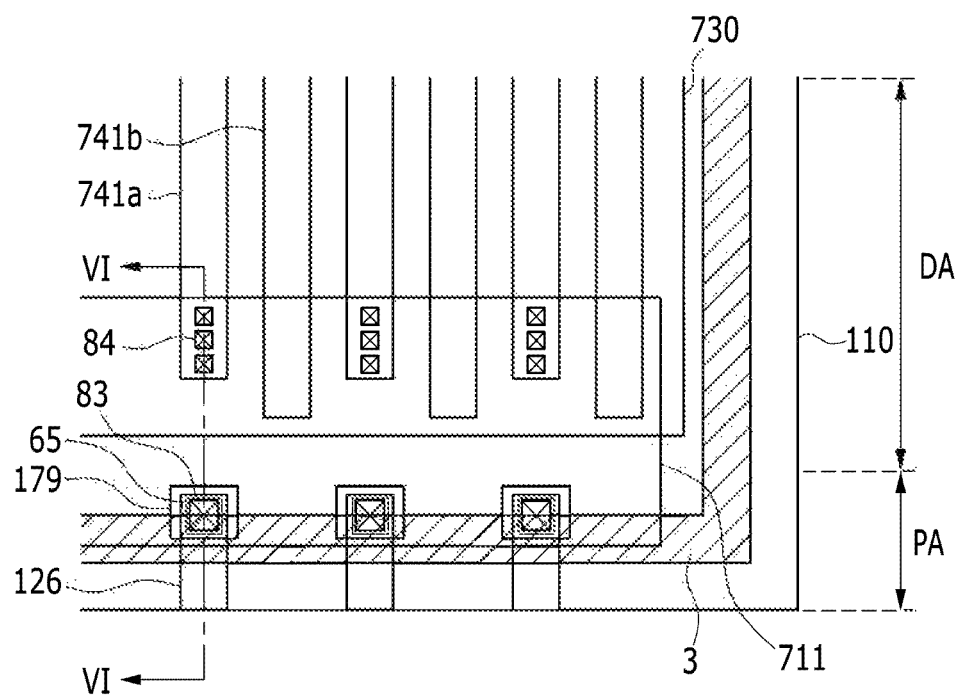
FIG. 5 is a schematic layout view of a lower region of a display area and a peripheral area adjacent thereto of an OLED display according to an exemplary embodiment of the present disclosure.
Figure 6:
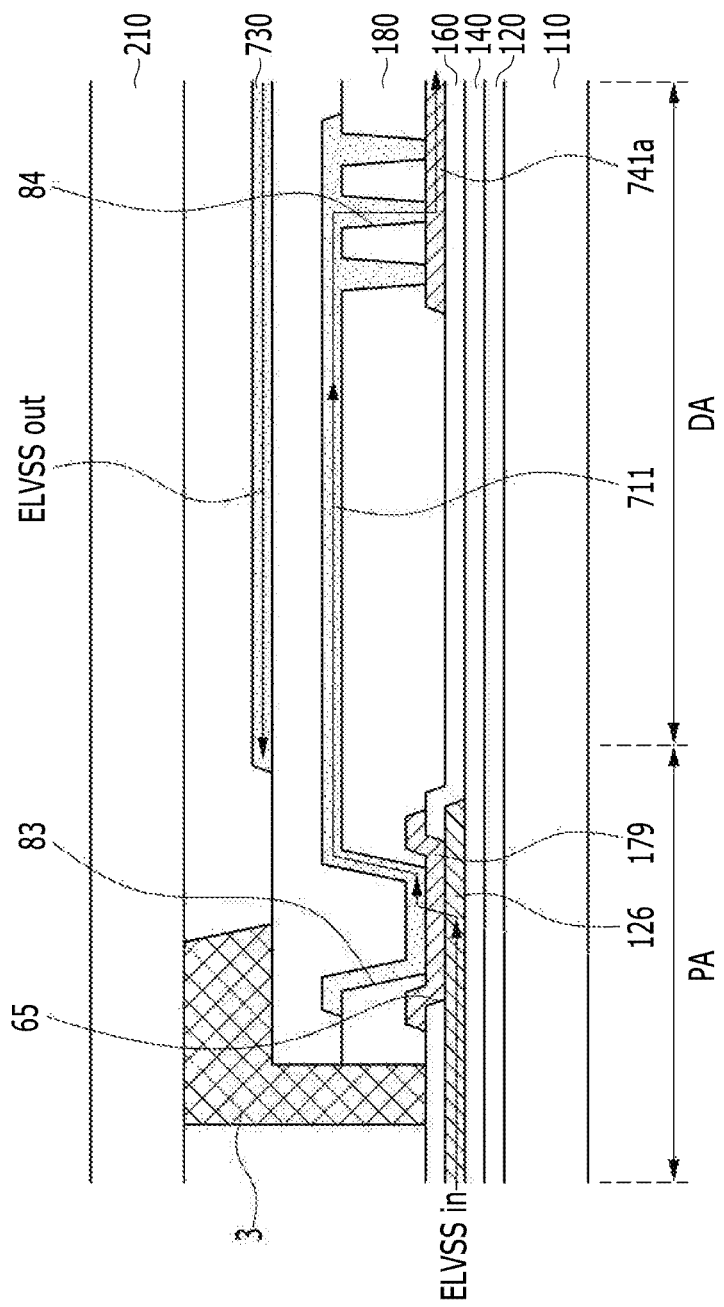
FIG. 6 is a cross-sectional view taken along line VI-VI of FIG. 5.

As shown in FIG. 5 and FIG. 6, a buffer layer 120 is formed on a display substrate 110. The buffer layer 120 can be formed to be a single layer of silicon nitride (SiNx) or a dual layer structure in which silicon nitride (SiNx) and silicon oxide (SiO2) are laminated. The buffer layer 120 serves to planarize a surface while simultaneously (or concurrently) preventing permeation of unnecessary elements such as impurities or moisture.

A gate insulating layer 140 is formed on the buffer layer 120. The gate insulating layer 140 can be a single layer or a multiple layers including at least one of silicon nitride and silicon oxide.

An external common voltage input section 126 for applying the common voltage to the display area DA is formed on the gate insulating layer 140 positioned in the peripheral area PA.

An interlayer insulating layer 160 covering the external common voltage input section 126 is formed thereon. The interlayer insulating layer 160 can be formed of silicon nitride or silicon oxide like the gate insulating layer 140. The interlayer insulating layer 160 has a first external contact hole 65 exposing a part of the external common voltage input section 126. The first external contact hole 65 has an assistance member (or peripheral connector) 179, and a common voltage input line 741a is formed on the interlayer insulating layer 160 positioned in the display area DA. A passivation layer 180 covering the assistance member 179 and the common voltage input line 741a is formed thereon. The passivation layer 180 can be formed of a stacked layer of an organic material such as polyacrylates resin, polyimides resin, or the like, or a stacked layer of an organic material and an inorganic material.

The passivation layer 180 has a second external contact hole 83 exposing the assistance member 179 and a third external contact hole 84 exposing the common voltage input line 741a. An external connecting member (or external connector) 711 is formed on the passivation layer 180. The external connecting member 711 contacts the assistance member 179 through the second external contact hole 83 and contacts the common voltage input line 741a through the third external contact hole 84. Accordingly, the common voltage ELVSS is input through the external common voltage input section 126 and transmitted to the common voltage input line 741a through the assistance member 179 and the external connecting member 711.

A pixel definition layer 350 covering the passivation layer 180 and the external connecting member 711 is formed thereon. The pixel definition layer 350 can be formed of organic materials such as polyacrylates resin, polyimides resin, and the like, and silica-based organic materials.

A common electrode 730 is formed on the pixel definition layer 350. The common electrode 730 is transmitted with the common voltage ELVSS out output through the common voltage output line 741b. An encapsulation substrate 210 faces the common electrode 730. A getter 3 is formed on the pixel definition layer 350 positioned in the peripheral area PA and the getter 3 encloses the display area DA. The getter 3 can include an absorbent.

Next, the detailed structure of the OLED display shown in FIG. 1 and FIG. 3 will be described with reference to FIG. 7, FIG. 8, FIG. 9, and FIG. 10, as well as FIG. 1 and FIG. 3.

Figure 7:
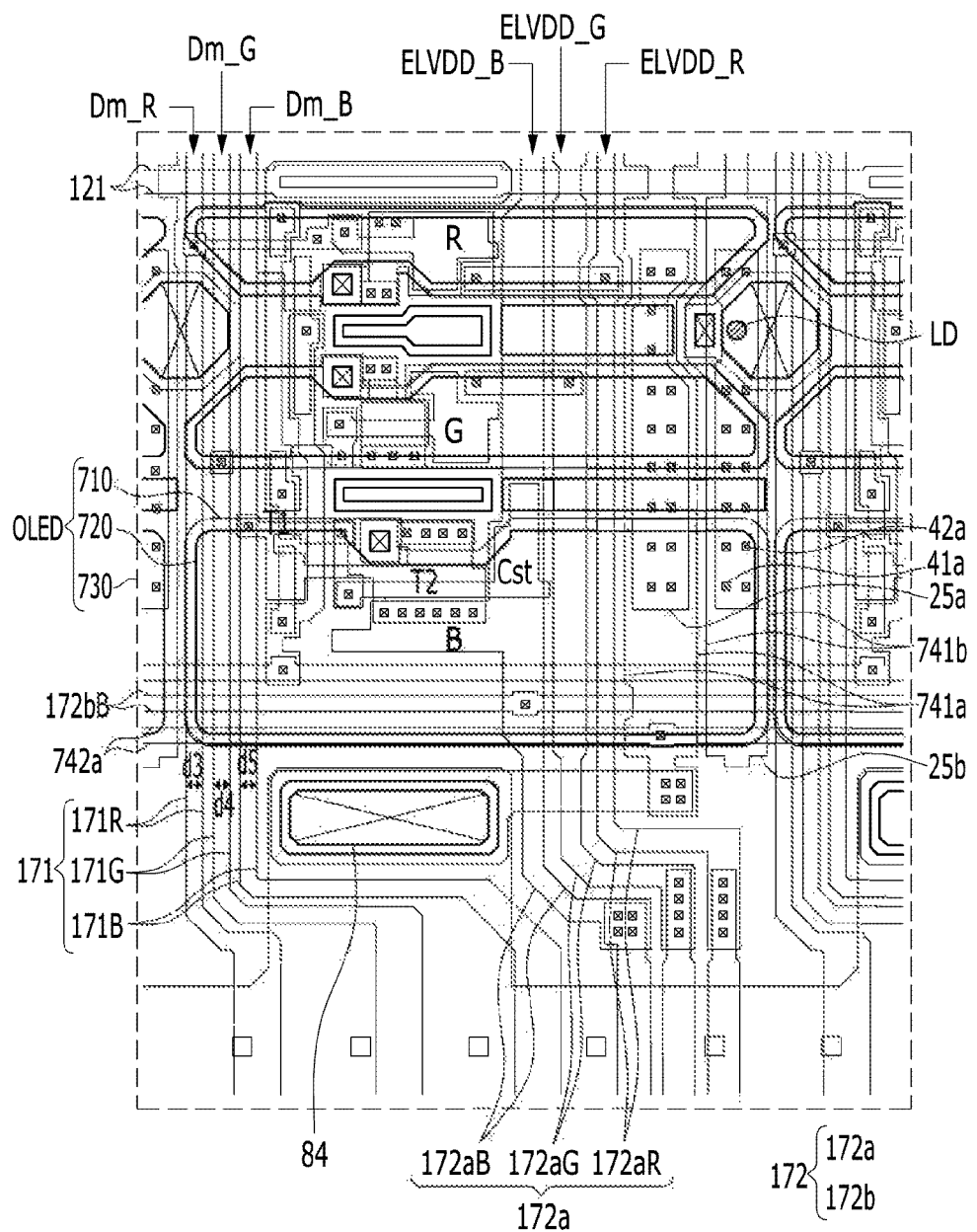
FIG. 7 is an enlarged layout view of portion A of FIG. 3, which is a lower region of a display area of an OLED display according to an exemplary embodiment of the present disclosure.
Figure 8:
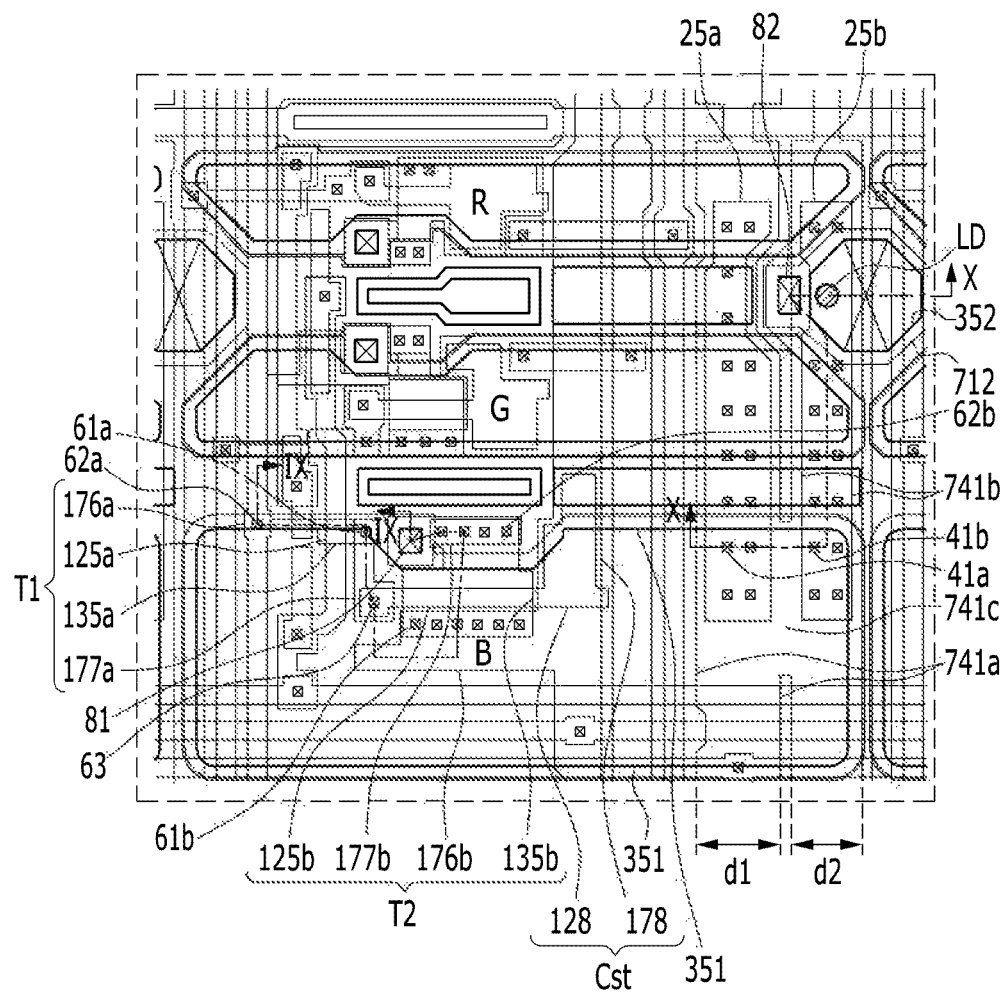
FIG. 8 is an enlarged layout view of portion B of FIG. 3, which is a center region of a display area of an OLED display according to an exemplary embodiment of the present disclosure.
Figure 9:
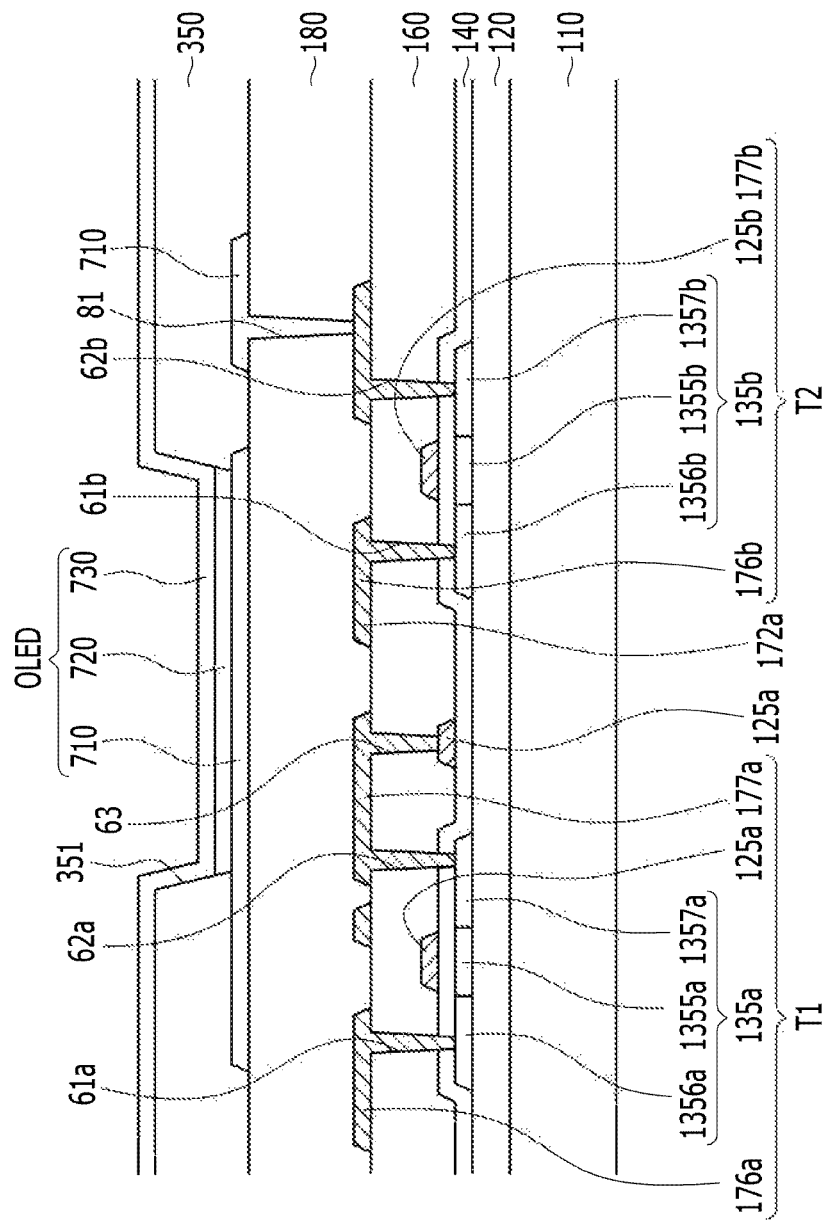
FIG. 9 is a cross-sectional view taken along line IX-IX of FIG. 8.
Figure 10:
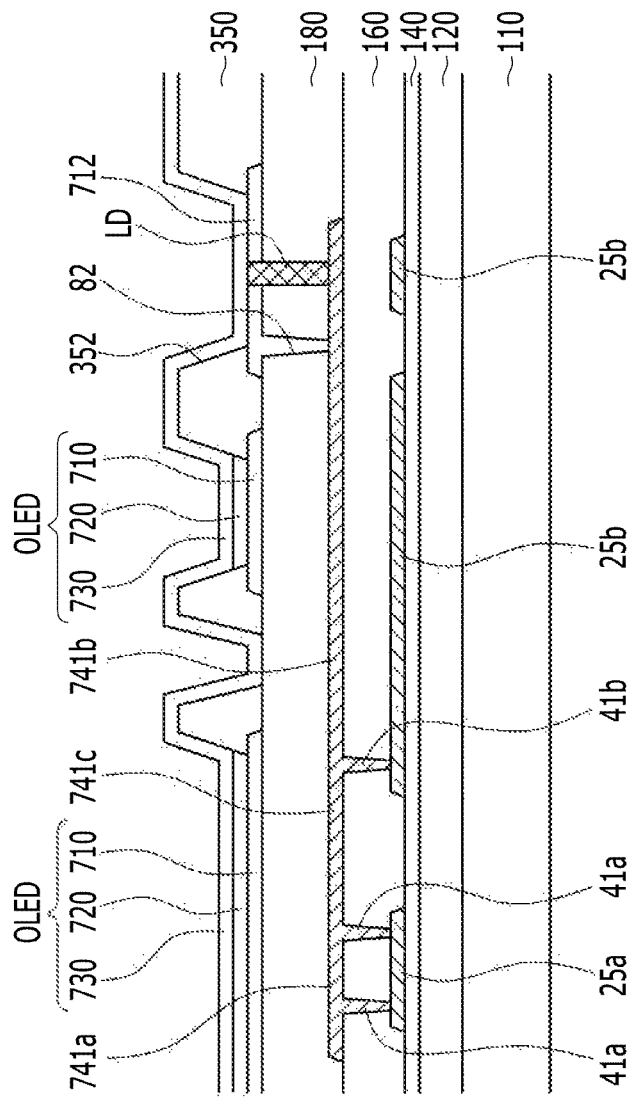
FIG. 10 is a cross-sectional view taken along line X-X of FIG. 8.

FIG. 7 is an enlarged layout view of portion A of FIG. 3, which is a lower region of a display area of an OLED display according to an exemplary embodiment of the present disclosure. FIG. 8 is an enlarged layout view of portion B of FIG. 3, which is a center region of a display area of an OLED display according to an exemplary embodiment of the present disclosure. FIG. 9 is a cross-sectional view taken along line IX-IX of FIG. 8, and FIG. 10 is a cross-sectional view taken along line X-X of FIG. 8.

Hereinafter, a detailed planar structure of the OLED display according to the exemplary embodiment of the present disclosure will first be described in detail with reference to FIG. 7 and FIG. 8, and a detailed cross-sectional structure will be described in detail with reference to FIG. 9 and FIG. 10.

First, as shown in FIG. 7 and FIG. 8, the plurality of pixels PX of the OLED display includes a red pixel (R), a green pixel (G), and a blue pixel (B) formed in the column direction.

Each pixel PX includes a scan line 121 applying a scan signal Sn formed in a row direction and a data line 171 crossing the scan line 121 and applying a data signal Dm to the pixel PX.

The data signal Dm includes a red data signal Dm_R, a green data signal Dm_G, and a blue data signal Dm_B, and the data line 171 includes a red data line 171R transmitting the red data signal Dm_R, a green data line 171G transmitting the green data signal Dm_G, and a blue data line 171B transmitting the blue data signal Dm_B.

The driving voltage line 172 transmitting the driving voltage ELVDD includes a vertical driving voltage line 172a substantially parallel to the data line 171 and a horizontal driving voltage line 172b substantially parallel to the scan line 121. The vertical driving voltage line 172a includes a red vertical driving voltage line 172aR transmitting a red driving voltage ELVDD_R, a green vertical driving voltage line 172aG transmitting the green driving voltage ELVDD_G, and a blue vertical driving voltage line 172aB transmitting the blue driving voltage ELVDD_B. The horizontal driving voltage line 172b includes a red horizontal driving voltage line (not shown) connected to the red vertical driving voltage line 172aR, a green horizontal driving voltage line (not shown) connected to the green vertical driving voltage line 172aG, and a blue horizontal driving voltage line connected to the blue vertical driving voltage line 172aB.

As described above, the driving voltage line 172 is formed of a mesh structure made of the vertical driving voltage line 172a and the horizontal driving voltage line 172b, thereby minimizing the voltage drop of the driving voltage ELVDD.

Also, each pixel PX includes a switching transistor T1, a driving transistor T2, a storage capacitor Cst, and an OLED.

Also, as shown in FIG. 3 and FIG. 7, the common voltage input line 741a formed in the lower region DP is separated from the common voltage output line 741b so as not to be connected to each other. In this case, the common voltage input line 741a is connected to a first low-resistance member 25a through the first low-resistance contact hole 41a, and the common voltage output line 741b is connected to the second low-resistance member 25b through the second low-resistance contact hole 41b. Accordingly, the resistance of the common voltage input line 741a and the common voltage output line 741b is minimized, thereby minimizing the IR drop.

Also, as shown in FIG. 3 and FIG. 8, the common voltage input line 741a and the common voltage output line 741b formed in the center line region CP are connected to each other through the common voltage connection part 741c.

The common voltage output line 741b contacts the dummy pixel electrode 712 through the dummy contact hole 82, and the common electrode 730 is directly deposited on the dummy pixel electrode 712. A laser is irradiated at the position of the dummy contact hole 82 such that the common electrode 730 and the common voltage output line 741b are short-circuited, thereby forming a laser connection part LD. Accordingly, the common electrode 730 is directly connected to the common voltage output line 741b.

As described above, by connecting the common voltage input line 741a and the common voltage output line 741b, which are separated from each other, by using the common voltage connection part 741c positioned at the center line region CP and connecting the common voltage output line 741b to the common electrode 730 through the laser connection part LD, the IR drop of the common voltage ELVSS is minimized and luminance uniformity is substantially simultaneously (or concurrently) improved.

On the other hand, the IR drop amount and the luminance uniformity can have a trade-off relationship such that optimization may be necessary.

The common voltage input line 741a is a main factor for determining a voltage drop amount of the common voltage ELVSS, and the common voltage output line 741b is a main factor for determining the luminance uniformity.

Table 1 represents a simulation result of the luminance uniformity depending on a width of the common voltage line 741 and the driving voltage line 172.

drop amount can be minimized and luminance uniformity can be obtained and optimized.

The structure of one pixel will be described in detail based on the blue pixel B.

As shown in FIG. 8, the switching transistor T1 of the blue pixel B includes a switching semiconductor layer 135a, a switching gate electrode 125a, a switching source electrode 176a, and a switching drain electrode 177a. The switching gate electrode 125a is connected to the scan line 121, and the switching source electrode 176a is a portion of the blue data line 171B.

The driving transistor T2 includes a driving semiconductor layer 135b, a driving gate electrode 125b, a driving source electrode 176b, and a driving drain electrode 177b. The driving gate electrode 125b is connected to the switching drain electrode 177a through the connection contact hole 64. The driving source electrode 176b is a portion of the

TABLE 1

| | Width (um) | | | | | Center | | Color LRU(%) | | |
|---|---|---|---|---|---|---|---|---|---|---|
| | common voltage input line | common voltage output line | ELVDD_R | ELVDD_G | ELVDD_B | ELVDD_R + G + B | luminance (nit) | LRU(%) | R | G | B |
| Experimental example 1 | 25 | 50 | 12 | 17 | 19 | 48 | 135 | 88.5 | 90 | 80 | 92 |
| Experimental example 2 | 12 | 55 | 14 | 21 | 21 | 56 | 115 | 92.8 | 90 | 88 | 90 |
| Experimental example 3 | 23 | 48 | 11 | 17 | 22 | 50 | 151 | 86.7 | 88 | 86 | 87 |
| Experimental example 4 | 40 | 31 | 11 | 17 | 22 | 50 | 169 | 87.6 | 91 | 86 | 83 |
| exemplary embodiment | 34 | 37 | 10 | 18 | 22 | 50 | 151 | 88 | 89 | 88 | 85 |

As shown in Table 1, referring to Experimental Example 1 and Experimental Example 2, as the width of the common voltage output line 741b is similar and the width of the common voltage input line 741a is narrow, a slight increase in the luminance uniformity LRU and a decrease in the center luminance can be confirmed.

Also, referring to Experimental Example 3 and Experimental Example 4, as the width of the common voltage output line 741b widens, a small deviation in the LRU deviation for a white balance can be confirmed. Also, since the voltage drop amount is increased if the width of the common voltage input line 741a is decreased, a higher voltage is required to obtain the luminance of the center region such that a side effect of increased power consumption is generated.

Accordingly, in an exemplary embodiment of the present disclosure, the width d2 of the common voltage output line 741b is larger than the width d1 of the common voltage input line 741a. As described above, by controlling the width d2 of the common voltage output line 741b and the width d1 of the common voltage input line 741a, the luminance can be uniform between the center line region CP and the upper region UP and the lower region DP.

Also, the sum of the width d3 of the red driving voltage line 172aR, the width d4 of the green driving voltage line 172aG, and the width d5 of the blue driving voltage line 172aB can be more than the width d1 of the common voltage output line 741b.

As described above, by controlling the widths of the common voltage output line 741b, the common voltage input line 741a, and the driving voltage line 172, the voltage vertical driving voltage line 172a and the driving drain electrode 177b is connected to the pixel electrode 710 through the pixel contact hole 81.

The storage capacitor Cst includes a first storage capacitive plate 128 and a second storage capacitive plate 178 overlapping each other. The first storage capacitive plate 128 is the portion extending from the driving gate electrode 125b, and the second storage capacitive plate 178 is a portion of the vertical driving voltage line 172a. The storage capacitance is determined by the charge charged in the storage capacitor Cst and the voltage between both capacitive plates 128 and 178.

Accordingly, the storage capacitor Cst stores the storage capacitance corresponding to the difference between the driving voltage ELVDD transmitted to the second storage capacitive plate 178 through the driving voltage line 172 and the gate voltage of the driving gate electrode 125b.

Next, the detailed cross-sectional structure will be described with reference to FIG. 9 and FIG. 10.

As shown in FIG. 9 and FIG. 10, the display substrate 110 of the OLED display according to an exemplary embodiment of the present disclosure can be an insulating display substrate made of glass, quartz, ceramic, or plastic.

A buffer layer 120 is formed on the display substrate 110. A switching semiconductor layer 135a and a driving semiconductor layer 135b are formed on the buffer layer 120 so as to be spaced apart from each other.

The semiconductor layers 135a and 135b can be formed of polysilicon or one selected from the group consisting of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). When the semiconductor layers 135a and 135b are formed of an oxide semiconductor, a separate protective layer can be added to protect the oxide semiconductor from the outside influences, such as a high temperature.

The switching semiconductor layer 135a is divided into a channel region 1355a with a source region 1356a and a drain region 1357a respectively formed at both sides of the channel region 1355a. The channel regions 1355a of the switching semiconductor layer 135a can include polysilicon in which an impurity is not doped, i.e., an intrinsic semiconductor, and the source region 1356a and the drain region 1357a of the switching semiconductor layer 135a can include polysilicon in which a conductive impurity is doped, i.e., an impurity semiconductor. Similarly, the driving semiconductor layer 135b is divided into a channel region 1355b and a source region 1356b, and a drain region 1357b is respectively formed at both sides of the channel region 1355b.

However, the doping degree of the semiconductors layer 135a and 135b is not limited thereto, and the semiconductor layers 135a and 135b can include the channel region channel-doped with an n-type impurity or a p-type impurity, and the source region and the drain region can be doped with a higher doping concentration than the doping impurity of the channel region.

A gate insulating layer 140 is formed on the switching semiconductor layer 135a and the driving semiconductor layer 135b.

A scan line 121, a switching gate electrode 125a, a driving gate electrode 125b, a first storage capacitive plate 128, a first low-resistance member 25a, and a second low-resistance member 25b are formed on the gate insulating layer 140.

The scan line 121 stretches in a horizontal direction and transmits the scan signal, and the switching gate electrode 125a is connected to the scan line 121 and overlaps the switching semiconductor layer 135a. The driving gate electrode 125b extends from the first storage capacitive plate 128 to the driving semiconductor layer 135b. The switching gate electrode 125a and the driving gate electrode 125b overlap the channel regions 1355a and 1355b, respectively.

An interlayer insulating layer 160 is formed on the scan line 121, the switching gate electrode 125a, the driving gate electrode 125b, the first storage capacitive plate 128, the first low-resistance member 25a, and the second low-resistance member 25b.

The interlayer insulating layer 160 and the gate insulating layer 140 have source contact holes 61a and 61b and drain contact holes 62a and 62b, respectively exposing the source regions 1356a and 1356b and the drain regions 1357a and 1357b. The interlayer insulating layer 160 has a connection contact hole 64 exposing the driving gate electrode 125b and a first low-resistance contact hole 41a and a second low-resistance contact hole 41b respectively exposing the first low-resistance member 25a and the second low-resistance member 25b.

A data line 171 having a switching source electrode 176a, a vertical driving voltage line 172a having a driving source electrode 176b and a second storage capacitive plate 178, a switching drain electrode 177a connected to the first storage capacitive plate 128, and a driving drain electrode 177b are formed on the interlayer insulating layer 160. Also, a common voltage input line 741a, a common voltage connection part 741c, and a common voltage output line 741b are formed on the interlayer insulating layer 160.

The switching source electrode 176a and the driving source electrode 176b are respectively connected to the source regions 1356a and 1356b through the source contact holes 61a and 61b. The switching drain electrode 177a faces the switching source electrode 176a, the driving drain electrode 177b faces the driving source electrode 176b, and the switching drain electrode 177a and the driving drain electrode 177b are respectively connected to the drain regions 1357a and 1357b through the drain contact holes 62a and 62b.

The switching drain electrode 177a extends to be electrically connected to the first storage capacitive plate 128 and the driving gate electrode 125b through the connection contact hole 64 formed in the interlayer insulating layer 160.

The second storage capacitive plate 178 protrudes from the driving voltage line 172 to overlap the first storage capacitive plate 128. Accordingly, the first storage capacitive plate 128 and the second storage capacitive plate 178 form the storage capacitor Cst having the interlayer insulating layer 160 as a dielectric material.

The common voltage connection part 741c is formed on the same layer and of the same material as the common voltage input line 741a, the common voltage output line 741b and the portion substantially extending from the common voltage input line 741a and the common voltage output line 741b.

A passivation layer 180 is formed on the data line 171, the vertical driving voltage line 172a, the switching drain electrode 177a and the driving drain electrode 177b, the common voltage input line 741a, the common voltage connection part 741c, and the common voltage output line 741b. The passivation layer 180 has a pixel contact hole 81 exposing the driving drain electrode 177b and a dummy contact hole 82 exposing the common voltage output line 741b.

A pixel electrode 710 and a dummy pixel electrode 712 are formed on the passivation layer 180. The pixel electrode 710 and the dummy pixel electrode 712 can be formed of a transparent conductive material, such as, ITO (indium tin oxide), IZO (indium zinc oxide), ZnO (zinc oxide), or In$_2$O$_3$ (indium oxide). The pixel electrode 710 is electrically connected to the driving drain electrode 177b of the driving transistor T2 through the pixel contact hole 81 of the passivation layer 180, thereby being the anode of the OLED. The dummy pixel electrode 712 is connected to the common voltage output line 741b through the dummy contact hole 82 formed in the passivation layer 180, thereby being a connection path of the common voltage ELVSS.

A pixel definition layer 350 is formed on the passivation layer 180 and the edge of the pixel electrode 710, and the edge of the dummy pixel electrode 712. The pixel definition layer 350 has a pixel opening 351 exposing the pixel electrode 710 and a dummy opening 352 exposing the dummy pixel electrode 712.

An organic emission layer 720 is formed in the pixel opening 351 of the pixel definition layer 350. The organic emission layer 720 is formed in multiple layers including an emission layer, and one or more of a hole-injection layer (HIL), a hole-transporting layer (HTL), an electron-transporting layer (ETL), and an electron-injection layer (EIL). In the case the organic emission layer 720 includes all of the layers, the hole-injection layer is positioned on the pixel electrode 710, which is an anode, and the hole-transporting layer, the emission layer, the electron-transporting layer, and the electron-injection layer can be sequentially laminated thereon.

The emission layer 720 can include a red emission layer emitting red light, a green emission layer emitting green light, and a blue emission layer emitting blue light. The red emission layer, the green emission layer, and the blue emission layer are formed in a red pixel, a green pixel, and a blue pixel, respectively, thereby implementing a color image.

The emission layer can include a red emission layer emitting red light, a green emission layer emitting green light, and a blue emission layer emitting blue light. The red emission layer, the green emission layer, and the blue emission layer are formed in a red pixel, a green pixel, and a blue pixel, respectively, thereby implementing a color image. As another example, white emission layers emitting white light are formed in all of the red pixel, the green pixel, and the blue pixel, and a red color filter, a green color filter, and a blue color filter are formed for each pixel, thereby implementing the color image. In the case of implementing the color image by using the white emission layers and the color filters, a deposition mask for depositing the red emission layer, the green emission layer, and the blue emission layer on respective pixels, i.e., the red pixel, the green pixel, and the blue pixel, does not need to be used.

The white organic emission layer described in another example can be formed by one organic emission layer, and includes a configuration in which a plurality of organic emission layers is laminated to emit white light. For example, the white organic emission layer can include a configuration which emits white light by combining at least one yellow organic emission layer and at least one blue organic emission layer, a configuration which emits white light by combining at least one cyan organic emission layer and at least one red organic emission layer, a configuration which emits white light by combining at least one magenta organic emission layer and at least one green organic emission layer, and the like.

A common electrode 730 is formed on the pixel definition layer 350 and the organic emission layer 720. The common electrode 730 can be formed of a transparent conductive material, such as, ITO (indium tin oxide), IZO (indium zinc oxide), ZnO (zinc oxide), or $In_2O_3$ (indium oxide), or a reflective metal, such as, lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 becomes the cathode of the OLED. The pixel electrode 710, the organic emission layer 720, and the common electrode 730 form the OLED.

A laser connection part (laser connector) LD in which the dummy pixel electrode 712 and the common electrode 730 are short-circuited is formed at the position of the dummy opening 352. Accordingly, the common electrode 730 directly contacts the common voltage output line 741b, thereby minimizing the IR drop.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An organic light-emitting diode (OLED) display comprising:
    a display substrate including a display area including a plurality of pixels and a peripheral area surrounding the display area;
    a plurality of scan lines disposed over the display substrate and configured to transmit a scan signal;
    a plurality of data lines and driving voltage lines crossing the scan lines and configured to respectively provide a data signal and a driving voltage;
    a plurality of switching elements electrically connected to the scan lines and data lines;
    a plurality of pixel electrodes electrically connected to the switching elements;
    an organic emission layer disposed over the pixel electrodes;
    a common electrode disposed over the organic emission layer; and
    a common voltage line disposed substantially parallel to the data lines and configured to transmit a common voltage to the common electrode,
    wherein the common voltage line includes i) a common voltage input line electrically connected to an external common voltage input electrode disposed in the peripheral area and ii) a common voltage output line electrically connected to the common electrode,
    wherein both of the common voltage input line and the common voltage output line at least partially cross the display area,
    wherein the common voltage line further includes a common voltage connector configured to electrically connect the common voltage input line to the common voltage output line,
    wherein the common voltage connector is disposed on the display area,
    wherein the display area includes a first region, a second region, and a center line region corresponding to the area between the first region and the second region, and wherein the common voltage connector is located in the center line region.

2. The OLED display of claim 1, wherein the first region is an upper region corresponding to an upper half of the display area, the second region is a lower region corresponding to a lower half of the display area, and the common voltage connector has a bended shape.

3. The OLED display of claim 2, further comprising:
    a dummy pixel electrode electrically connected to the common voltage output line; and
    a laser connector directly connected to the common electrode and the common voltage output line.

4. The OLED display of claim 3, wherein the common voltage line is disposed on the same layer as the data line and the driving voltage line.

5. The OLED display of claim 4, further comprising an interlayer insulating layer covering the scan line, wherein the common voltage line is disposed over the interlayer insulating layer.

6. The OLED display of claim 5, further comprising a passivation layer covering the interlayer insulating layer and the common voltage line, wherein the dummy pixel electrode is disposed over the passivation layer.

7. The OLED display of claim 6, wherein the laser connector penetrates the passivation layer and the dummy pixel electrode.

8. The OLED display of claim 2, wherein the common voltage input line includes an upper common voltage input line located in the upper region and a lower common voltage input line located in the lower region, wherein the common voltage output line includes an upper common voltage output line located in the upper region and a lower common voltage output line located in the lower region, wherein the upper common voltage input line and the upper common voltage output line are separated from and substantially parallel to each other, and wherein the lower common voltage input line and the lower common voltage output line are separated from and substantially parallel to each other.

9. The OLED display of claim 8, wherein the external common voltage input electrode includes a first external common voltage input electrode adjacent to the upper region and a second external common voltage input electrode adjacent to the lower region, wherein the first external common voltage input electrode is electrically connected to the upper common voltage input line, and wherein the second external common voltage input electrode is electrically connected to the lower common voltage input line.

10. The OLED display of claim 2, wherein the width of the common voltage output line is greater than the width of the common voltage input line.

11. The OLED display of claim 2, wherein the pixels include red, green and blue pixels configured to respectively emit red, green and blue colors, wherein the driving voltage lines includes red, green and blue driving voltage lines electrically connected to the red, green and blue pixels, respectively, and wherein the sum of the widths of the red, green and blue driving voltage lines is greater than the width of the common voltage output line.

12. The OLED display of claim 2, wherein the switching element includes a switching transistor and a driving transistor, and wherein the OLED display further comprises a digital driver disposed in the peripheral area and configured to drive the OLED display using a digital driving method configured to control an emission time via a switching operation of the driving transistor so as to generate a gray scale to drive the pixels.

13. An organic light-emitting diode (OLED) display comprising:
 a display panel including a display area and a peripheral area surrounding the display area, wherein the display area includes an upper region and a lower region;
 upper and lower timing controllers configured to receive an image signal and output a control signal, wherein the display panel is located between the upper and lower timing controllers;
 upper and lower data drivers configured to receive the control signal and provide a data signal to the display area, wherein the upper data driver is located between the upper timing controller and the display panel, and wherein the lower data driver is located between the lower timing controller and the display panel;
 upper and lower organic light-emitting diodes (OLEDs) disposed in the display area, wherein the upper OLEDs are disposed in the upper region of the display area, and wherein the lower OLEDs are disposed in the lower region of the display area; and
 upper and lower common voltage lines each configured to transmit a common voltage from the upper and lower timing controllers to the upper and lower OLEDs, respectively.

14. The OLED display of claim 13, wherein each of the upper and lower common voltage lines includes i) a common voltage input line connected to the respective timing controller, ii) a common voltage output line connected to the OLEDs and iii) a common voltage connector connected to the common voltage input and output lines.

15. The OLED display of claim 14, further comprising:
 an external common voltage input electrodes disposed in the peripheral area and connected to one of the upper and lower timing controllers;
 a peripheral connector disposed on the external common voltage input electrode; and
 an external connector connected to the peripheral connector and one of the upper and lower common voltage input lines,
 wherein the external common voltage input electrode, the peripheral connector and the external connector are configured to transmit the common voltage from the one of the upper and timing controllers to at least one of the OLEDs.

16. The OLED display of claim 15, wherein each of the OLEDs includes a common electrode disposed over the external connector.

17. The OLED display of claim 16, wherein the thickness of the common electrode is similar to the thickness of the external connector.

18. The OLED display of claim 14, wherein the display area further includes a center region located between the upper and lower regions, and wherein the common voltage connector is located in the center region and not the upper and lower regions.

19. The OLED display of claim 18, wherein the common voltage input line, common voltage output line and common voltage connector are disposed on the same layer.

* * * * *